United States Patent

Yoshiba

[11] Patent Number: 5,903,576
[45] Date of Patent: May 11, 1999

[54] MEMORY TEST SYSTEM

[75] Inventor: Kazumichi Yoshiba, Gyoda, Japan

[73] Assignee: Advantest Corp., Tokyo, Japan

[21] Appl. No.: 08/877,036

[22] Filed: Jun. 17, 1997

[30] Foreign Application Priority Data

Jun. 24, 1996 [JP] Japan .................................. 8-182754

[51] Int. Cl.$^6$ .................................................. G11C 7/00
[52] U.S. Cl. ................................................... 371/21.3
[58] Field of Search ............................... 371/21.1, 21.2, 371/21.3, 21.4, 21.6; 365/201, 185.04

[56] References Cited

U.S. PATENT DOCUMENTS 5,574,684  11/1996  Tomoeda .................................. 371/22
5,579,272  11/1996  Uchida .................................... 371/21

*Primary Examiner*—Vincent P. Canney
*Attorney, Agent, or Firm*—Muramatsu & Associates

[57] ABSTRACT

A memory test system is to perform two or more comparison operations within one test cycle. The memory test system includes a pattern generator for generating test data patterns to be supplied to the memory device under test, a data selector for providing the test data patterns in a parallel fashion at a plurality of ports, a test data multiplexer for selecting one of the test data patterns at the plurality of ports to supply a plurality of test data patterns to the memory device in a series fashion within each of the predetermined test cycle, an expected value select circuit for selectively providing the test data pattern as expected value data in a parallel fashion, and a logic comparator for receiving, in a parallel fashion, an output signal from the memory device under test generated as a result of the test data patterns and comparing, in parallel, the output signals with the expected value data from the expected value select circuit.

8 Claims, 4 Drawing Sheets

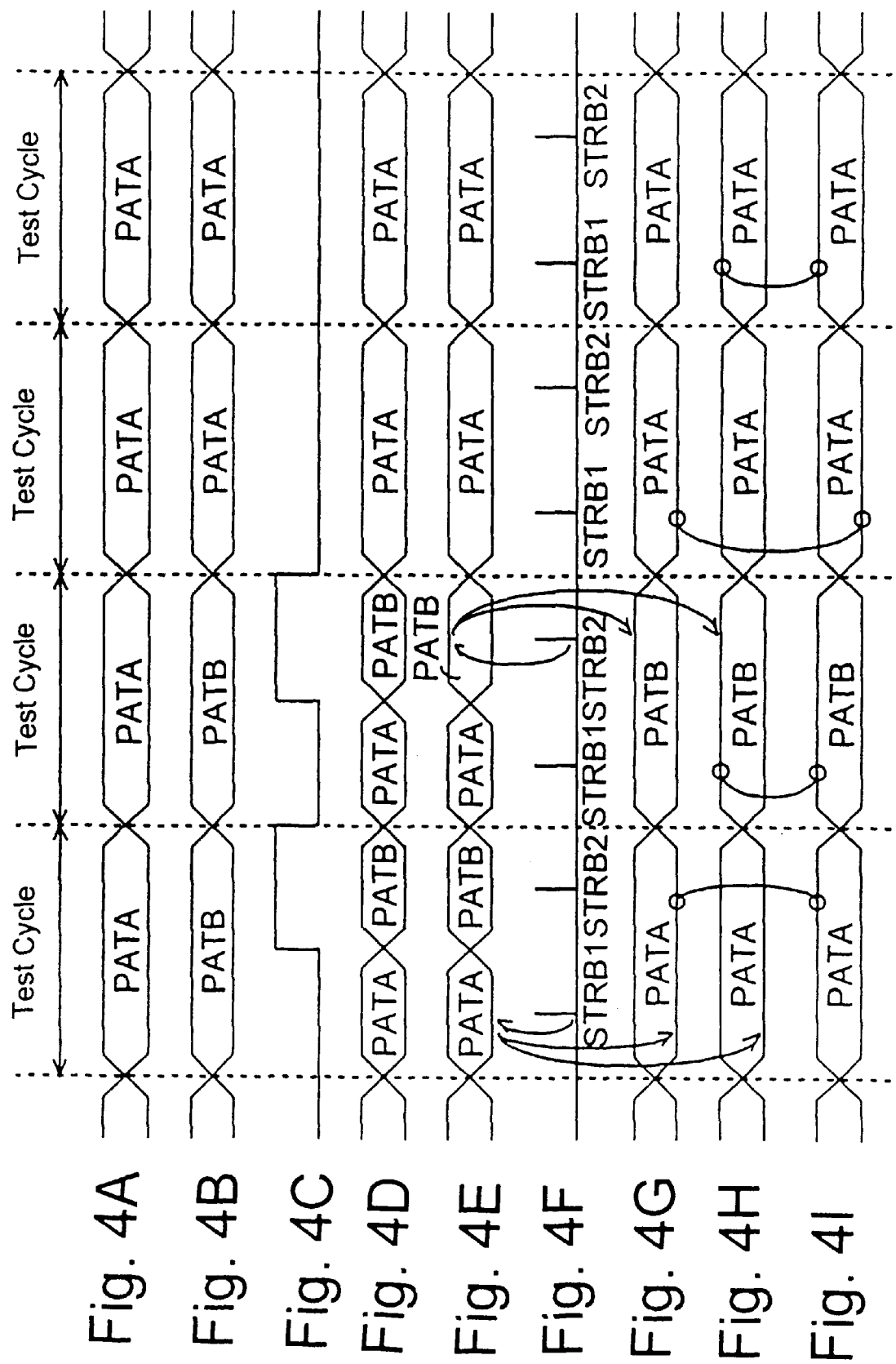

MEMORY TEST SYSTEM

FIELD OF THE INVENTION

This invention relates to a memory test system for testing semiconductor memory devices, and more particularly, to a memory test system which is capable of applying a plurality of test patterns to the memory device under test in a time division manner and comparing the resultant outputs of the memory under test within one cycle of a test rate of the test system in a parallel fashion.

BACKGROUND OF THE INVENTION

In a memory test system for testing semiconductor memory devices, a test data pattern is provided to a memory device under test and a resultant output from the memory device is compared with an expected value pattern established in advance to determined whether the memory device under test works correctly or not. The results of the test are stored in a fail memory with respect to each address of the memory device under test types of fail and other information regarding the memory device under test.

In a high speed memory test system, time divisional technique (data multiplex mode) is utilized to increase the test speed wherein a plurality of test data patterns are applied to the memory device under test within each test cycle. The test cycle is a basic rate of the memory test system for which a normal test operation is performed. In the data multiplex mode, two or more test patterns in parallel are multiplexed in a time sequential manner to produce a series test pattern whose data rate is two or more times higher than the test cycle.

An example of such a memory test system in the conventional technology is shown in FIGS. 3 and 4. FIG. 3 is a block diagram showing a basic structure of such a conventional memory test system. FIG. 4 is a timing chart showing the operation of the memory test system of FIG. 3. In the timing chart of FIG. 4, the data multiplex mode (first and second test cycles) and the normal test mode (third and fourth test cycles) are shown to illustrate the operational differences between the two modes. Further, the timing chart of FIG. 4 is a simplified illustration of the test data and expected value data with respect to the test cycles and thus the detailed timings or phase delays are not accurately described.

As shown in FIG. 3, the conventional memory test system includes an algorithmic pattern generator (ALPG) 10, a programmable data selector (PDS) 20, a wave formatter circuit 30, an expected value select circuit 40, a logic comparator 50, a driver 61 and an analog comparator 62. Typical semiconductor memories to be tested (MUT) by the memory test system include dynamic random access memories (DRAM) and static random access memories (SRAM).

The ALPG 10 is a pattern generator which is capable of generating a test pattern of mathematical sequence to test a memory device 70. The test pattern includes a data pattern for testing the memory device 70 under test and a pattern select signal PATSEL for selecting the data pattern to be applied to the memory device 70.

The PDS 20 selectively assigns the data pattern from the ALPG 10 to a plurality of ports, in this example, a port A and a port B for each test cycle. As shown in FIGS. 4A and 4B, in the normal mode (third and fourth cycles), an identical data pattern is produced at the ports A and B. In the data multiplex mode (first and second cycles), different data patterns PATA and PATB are respectively produced at the ports A and B in a parallel fashion.

The wave formatter circuit 30 is to format the waveform of the data pattern to be supplied to the memory device 70 under test. For example, as is known in the art, the wave formatter produces either a return to zero (RZ) waveform, a non-return to zero (NRZ) waveform or an exclusive OR (EOR) waveform. As shown in FIG. 3, the wave formatter circuit 30 includes a multiplexer 31 and a formatter 32. The multiplexer 31 selects one of the data patterns from the ports A and B based on the pattern select signal PATSEL. The formatter 32 produces the above noted waveforms.

In the data multiplex mode, the pattern select signal PATSEL of FIG. 4C changes the state within the test cycle so that the data patterns PATA and PATB are alternately selected within the test cycle as shown in FIG. 4D. As a consequence of this time divisional operation, a test signal pattern having two data patterns in one test cycle as shown in FIG. 4D can be generated by the wave formatter 30.

In FIG. 3, the test data pattern from the wave formatter 30 is provided to the driver 61 wherein the amplitude is regulated for the test purpose and is applied to the memory device 70. An output voltage level of the memory device 70 is compared with reference voltages (not shown) by the analog comparator 62 to determine whether the output signal of the memory 70 in response to the test data is logic "1" or logic "0". Thus, the output of the analog comparator 62 as shown in FIG. 4E is provided to the logic comparator 50 wherein it is compared with the expected value data as described in more detail below.

The expected value select circuit 40 includes a multiplexer 41 and a register 43. Generally, in testing memory devices, expected value data is the same as the data pattern that is written in the memory device under test because the resultant data from the memory device should be the test data read out from the memory device. Thus, the multiplexer 41 selects one of the test data patterns from the port A or B based on the data from the register 43. In the conventional memory test system of FIG. 3, in either the multiplex mode or the normal mode, only one of the data patterns is used as expected value data.

The logic comparator 50 receives the output of the memory device 70 under test through the analog comparator 62 and compares the logic state of the output of the memory device 70 with the expected value data. In this example, the logic comparator 50 includes latches 51 and 52 and exclusive OR gates 53 and 54. As is well known in the art, the exclusive OR gate detects whether the two incoming signals coincide with each other.

The latches 51 and 52 receive the device logic output from the analog comparator 62 and latch the device logic output signal at the timings of strobe signals. The output of the latch 51 is connected to an input of the exclusive OR gate 53 while the output of the latch 52 is connected to an input of the exclusive OR gate 54. The output of the expected value select circuit 40 is connected to the other inputs of the exclusive OR gates 53 and 54.

A strobe signal $STRB_1$ is provided to the latch 51 to latch the device logic output at the timing of the strobe signal $STRB_1$. The latched logic output shown in FIG. 4G from the latch 51 is compared with the expected value data by the exclusive OR gate 53. A strobe signal $STRB_2$ is provided to the latch 52 to latch the device logic output at the timing of the strobe signal $STRB_2$. The latched logic output shown in FIG. 4H from the latch 52 is compared with the expected value data by the exclusive OR gate 54. The timings of the strobe signals are so regulated as shown in FIG. 4F that the strobe signal $STRB_1$ can latch the first half of the output signal of the memory device and the strobe signal $STRB_2$ can latch the last half of the output signal of the memory device within one test cycle.

However, in the data multiplex mode shown in the first two test cycles of FIG. 4, the conventional memory test system cannot perform two comparison operations within one test cycle in the data multiplex mode. This is because the expected value data of FIG. 4I from the expected value select circuit 40 is not multiplexed in real time as noted above. Therefore, it is necessary to carry out two test procedures to complete the test.

Namely, in the first test procedure, the logic output (PATA) of FIG. 4G is compared with the expected value data (PATA) of FIG. 4I by the timing of the strove signal $STRB_1$. After all the test is done for the logic output of FIG. 4G, in the second test procedure, the logic output (PATB) of FIG. 4H is compared with the expected value data (PATB) shown in the hatched portion of FIG. 4I by the timing of the strove signal $STRB_2$.

As in the foregoing, in the conventional memory test system, two or more test patterns can be supplied to the memory device under test within one test cycle to test the high speed memory device. However, in comparing the output of the memory device under test, it is not possible to perform two operations within one test cycle, since two or more different expected value patterns cannot be obtained within the one test cycle. Therefore, to complete the memory device test, it is necessary to repeat two or more test procedures as noted above by changing the expected value data, which results in a long test time.

SUMMARY OF THE INVENTION

Therefore, it is an object of the present invention to provide a memory test system which is capable of supplying two or more test data patterns to a memory device under test in a multiplex mode and evaluating the resultant output of the memory device by two or more expected value data at the same time.

It is another object of the present invention to provide a semiconductor memory test system which is capable of supplying two or more test data patterns to a memory device under test in a multiplex mode and comparing the resultant output of the memory device by two or more expected value data within one test cycle.

It is a further object of the present invention to provide a semiconductor memory test system which is capable of carrying out the memory device test in a short period of time without repeating comparison operations.

The semiconductor memory test system of the present invention makes it possible to generate a plurality of test data patterns within one test cycle to be applied to a memory device under test and to compare the resultant output of the memory device with a plurality of expected data patterns within one test cycle. In the semiconductor memory test system of the present invention, two or more comparison operations are carried out within one test cycle. The memory test system has an expected value select circuit which provides a plurality of expected data pattern in a parallel form to a logic comparator. The resultant output of the memory device under test is compared with the plurality of expected data patterns by the corresponding comparator circuits in a parallel form at the same time.

The memory test system of the present invention for testing a semiconductor memory device by applying a test pattern to a memory device under test for a predetermined test cycle and comparing the resultant output of the memory device under test with expected value data to determine whether the memory device functions correctly or not, includes: a pattern generator for generating test data patterns to be supplied to the memory device under test, a data selector for receiving the test data patterns from the pattern generator and providing the test data patterns in a parallel fashion at a plurality of ports, a test data multiplexer for selecting one of the test data patterns at the plurality of ports to supply a plurality of test data patterns to the memory device in a series fashion within each of the predetermined test cycle, an expected value select circuit for selectively providing the test data pattern as expected value data in a parallel fashion, and a logic comparator for receiving, in a parallel fashion, an output signal from the memory device under test generated as a result of the test data patterns and comparing, in parallel, the output signals of the memory device with the expected value data from the expected value select circuit.

According to the present invention, the memory test system is capable of supplying two or more test data patterns to a memory device under test in a multiplex mode and evaluating the resultant output of the memory device by two or more expected value data in parallel at the same time. Further, the memory test system of the present invention is capable of supplying two or more test data patterns to a memory device under test in a multiplex mode and comparing the resultant output of the memory device by two or more expected value data within one test cycle. As a consequence, the memory test system of the present invention can carry out the memory device test in a short period of time without repeating the comparison operations.

BRIEF DESCRIPTION OF THE DRAWINGS

FIG. 4 is a timing chart showing the operation of the conventional memory test system of the present invention.

DETAILED DESCRIPTION OF THE PREFERRED EMBODIMENT

The semiconductor memory test system of the present invention makes it possible to generate a plurality of test data patterns within one test cycle to be applied to a memory device under test and to compare the resultant output of the memory device with a plurality of expected data patterns within one test cycle. An embodiment of the memory test system of the present invention is shown in FIGS. 1 and 2.

Figure 1:
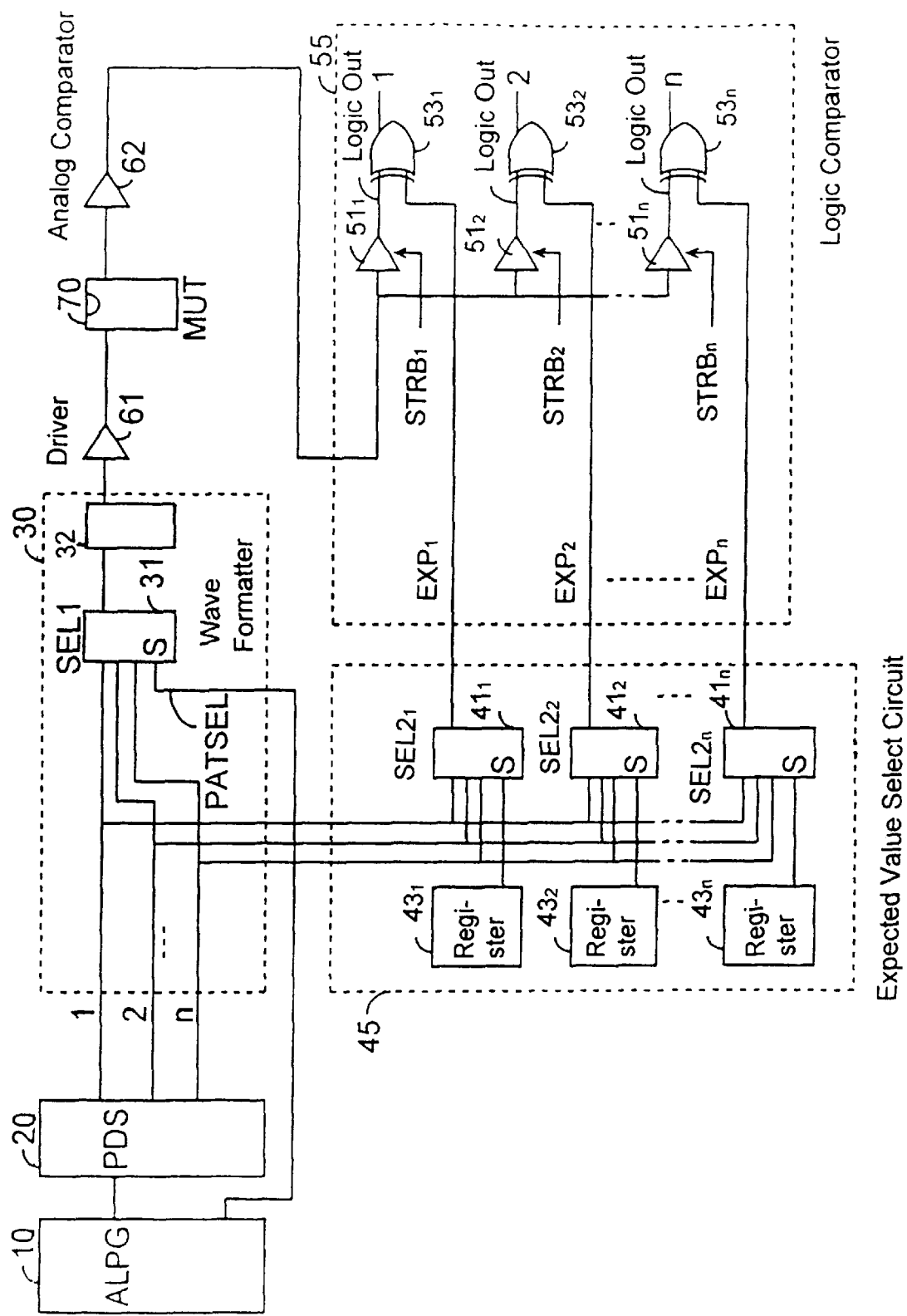
FIG. 1 is a block diagram showing a structure of the memory test system of the present invention.
Figure 2:
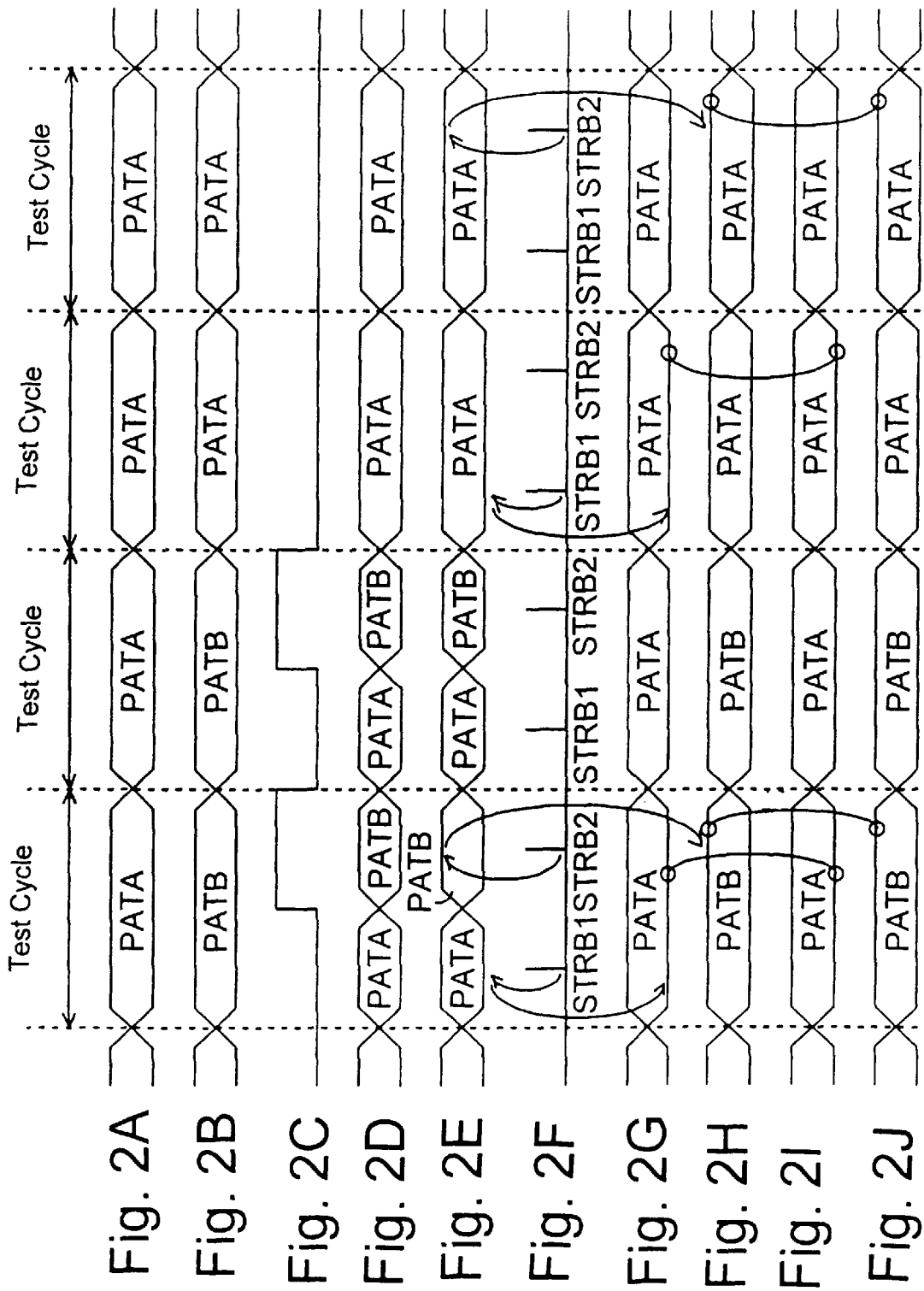
FIG. 2 is a timing chart showing the operation of the memory test system of the present invention.

FIG. 1 is a block diagram showing a structure of the memory test system of the present invention and FIG. 2 is a timing chart showing the operation of the memory test system of FIG. 1. In the timing chart of FIG. 2, the data multiplex mode (first and second test cycles) and the normal cycles (third and fourth test cycles) are shown to illustrate the operational differences between the two modes. The timing chart of FIG. 2 is a simplified illustration of the test data and expected value data with respect to the test cycles and thus the detailed timings or phase delays are not accurately described. Further, the example of FIG. 2 shows a case where two data patterns are multiplexed in the data multiplex mode.

The example of FIG. 1 is formed of an algorithmic pattern generator (ALPG) 10, a programmable data selector (PDS)

20, a wave formatter circuit 30, an expected value select circuit 45, a logic comparator 55, a driver 61 and an analog comparator. The expected value select circuit 45 includes a plurality of register and multiplexer pairs. Namely, the select circuit 45 is provided with a pair of a register $43_1$, and a multiplexer $SEL_1$, a pair of a register $43_2$ and a multiplexer $SEL_2$, ... and a pair of a register $43_n$ and a multiplexer $SEL_n$.

Figure 3:
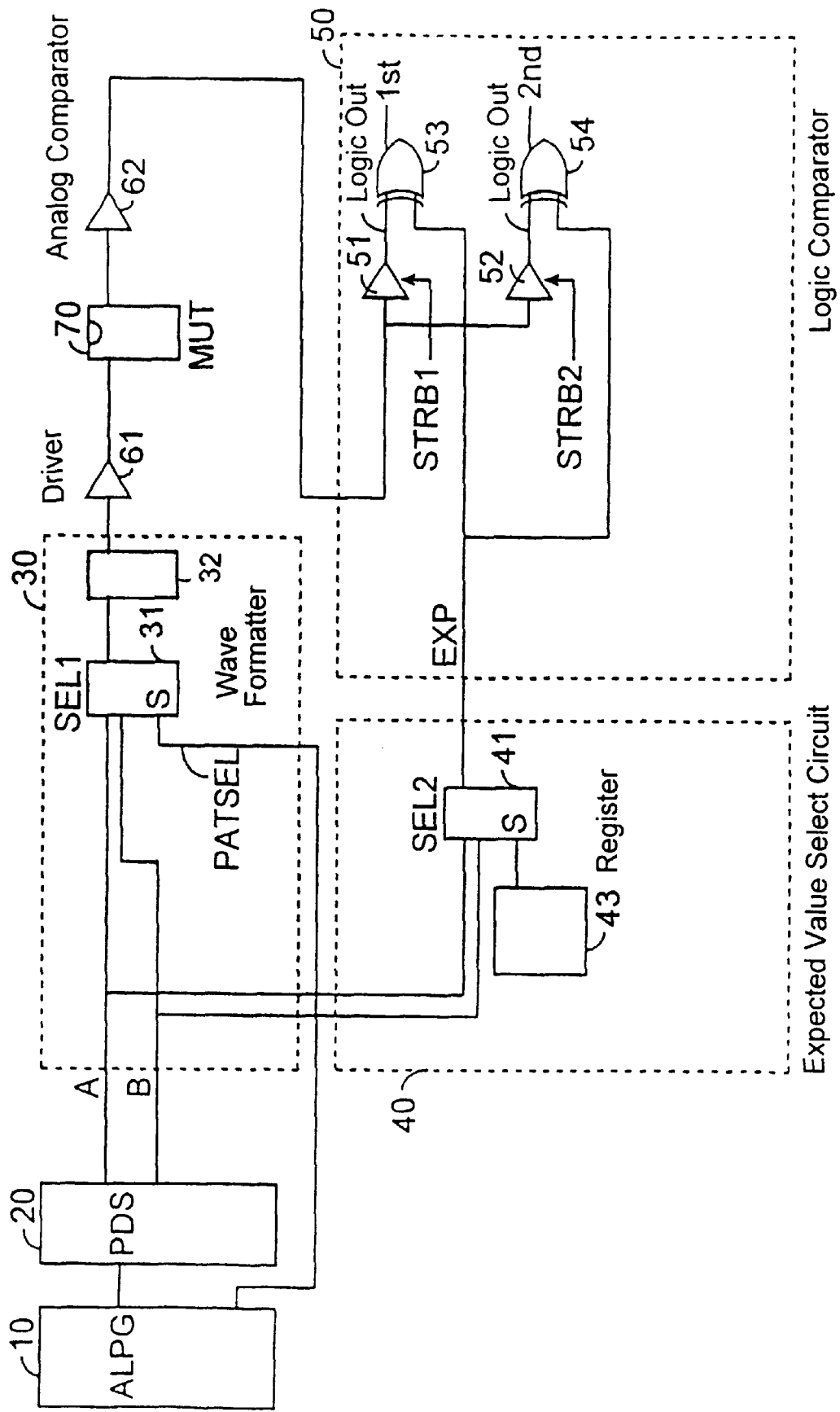
FIG. 3 is a block diagram showing a structure of the conventional memory test system of the present invention.

The algorithmic pattern generator (ALPG) 10, the programmable data selector (PDS) 20, and the wave formatter circuit 30 are basically the same as those of the conventional example of FIGS. 3 and 4. Namely, the ALPG 10 is a pattern generator which is capable of generating a test data pattern of mathematical sequence to test a memory device 70. Other types of pattern generators are also applicable to the present invention. The test data pattern includes a data pattern for testing the memory device 70 under test and a pattern select signal PATSEL for selecting the data pattern to be applied to the memory device 70.

The PDS 20 selectively assigns the test data pattern from the ALPG 10 to a plurality of ports, in this example, ports 1, 2 ... and n in a parallel form for each test cycle. As shown in FIGS. 2A and 2B, in the normal mode (third and fourth cycles), an identical data pattern is produced at the ports 1 and 2. In the data multiplex mode (first and second cycles), different data patterns PATA and PATB are respectively produced at the ports 1 and 2.

The wave formatter circuit 30 is to format the waveform of the data patterns to be supplied to the memory device 70 under test. For example, as noted above with respect to the conventional technology, the wave formatter 30 produces a test pattern with a return to zero (RZ) waveform, a non-return to zero (NRZ) waveform or an exclusive OR (EOR) waveform. As shown in FIG. 1, the wave formatter circuit 30 includes a multiplexer 31 and a formatter 32. The multiplexer 31 selects one of the data patterns from the ports 1, 2 ... and n based on the pattern select signal PATSEL from the pattern generator. The formatter 32 produces the above exemplified waveforms.

In the data multiplex mode, the pattern select signal PATSEL of FIG. 2C changes the state within the test cycle so that the data patterns PATA and PATB are alternately selected within the test cycle as shown in FIG. 2D. As a consequence of this time divisional operation, a test signal pattern having two data patterns in one cycle can be generated by the wave formatter 30 as in FIG. 2D.

In FIG. 1, the test data pattern is provided to the driver 61 wherein the amplitude of the test pattern is regulated and is applied to the memory device 70. An output voltage level of the memory device 70 is compared with a reference voltages (not shown) by the analog comparator 62 to determine whether the output signal of the memory 70 is logic "1" or logic "0". Thus, the output of the analog comparator 62 as shown in FIG. 2E is provided to the logic comparator 50 wherein it is compared with the expected value data as described in more detail below.

As noted above, the expected value select circuit 45 includes the multiplexer $41_1$–$41_n$ and the registers $43_1$–$43_n$. Generally, in testing memory devices, expected value data is the same as the data pattern that is written in the memory device under test. Thus, in this example of FIG. 1, the multiplexer $41_1$, selects the data pattern from the port 1 as expected value data $EXP_1$ based on the data from the register $43_1$. The multiplexer $41_2$ selects the data pattern from the port 2 as expected value data $EXP_2$ based on the data from the register $43_2$. The multiplexer $41_n$, selects the data pattern from the port 2 as expected value data $EXP_n$ based on the data from the register $43_n$. Thus, in the example of FIG. 2, the expected value data $EXP_1$ showing the data pattern PATA of FIG. 2I and the expected value data $EXP_2$ showing the data pattern PATB of FIG. 2J are respectively prepared for the logic comparator 55.

In FIG. 1, the logic comparator 55 receives the output of the memory device 70 under test through the analog comparator 62 and compares the logic state of the memory device 70 with the expected value data. In this example, the logic comparator 55 includes latches $51_1$, $52_2$ ... $51_n$ and exclusive OR gates $53_1$, $53_2$ ... $53_n$. Each of the latches $51_1$, $52_2$ ... $51_n$ receives the device logic output from the analog comparator 62 and latch the device logic output at the timing of a strobe signal. Each of the exclusive OR gates detects the coincidence between the two or more input signals. Other circuit arrangements are also possible to perform this comparison function for the two or more input signals.

The output of the latch $51_1$ is connected to an input of the exclusive OR gate $53_1$ while the output of the latch $51_2$ is connected to an input of the exclusive OR gate $53_2$. Similarly, the output of the latch $51_n$ is connected to an input of the exclusive OR gate $53_n$. The expected value data $EXP_1$ is provided to the other input of the exclusive OR gate $53_1$. The expected value data $EXP_2$ is provided to the other input of the exclusive OR gate $53_2$. Similarly, the expected value data $EXP_n$ is provided to the other input of the exclusive OR gate $53_n$.

Strobe signals $STRB_1$, $STRB_2$ ... $STRB_n$ are respectively provided to the latches $51_1$, $51_2$ ... $51_n$ to latch the device logic output at the timings of the respective strobe signals. Thus, by the strobe signal $STRB_1$, the latched logic output shown in FIG. 2G is provided to the exclusive OR gate $53_1$. By the strobe signal $STRB_2$, the latched logic output shown in FIG. 2H is provided to the exclusive OR gate $53_2$. The timings of the strobe signals are set as shown in FIG. 2F so that the strobe signal $STRB_1$ can latch the first half of the device output signal and the strobe signal $STRB_2$ can latch the last half of the device output signal within one test cycle.

Thus, in the multiplex mode shown in the first two test cycles of FIG. 2, two comparison operations are performed within one test cycle. Namely, the logic output of FIG. 2G is compared with the expected value data of FIG. 2I by the exclusive OR gate $53_1$ within one test cycle. Further, within the same test cycle, the logic output of FIG. 2H is compared with the expected value data of FIG. 2J by the exclusive OR gate $53_2$. In the arrangement of the present invention, by selecting one of the data pattern for all of the expected value data, the normal mode shown in the third and fourth test cycles can be performed.

According to the present invention, the memory test system is capable of supplying two or more test data patterns to a memory device under test in a multiplex mode and evaluating the resultant output of the memory device by two or more expected value data in parallel at the same time. Further, the memory test system of the present invention is capable of supplying two or more test data patterns to a memory device under test in a multiplex mode and comparing the resultant output of the memory device by two or more expected value data within one test cycle. As a consequence, the memory test system of the present invention can carry out the memory device test in a short period of time without repeating the comparison operations.

What is claimed is:

1. A memory test system for testing a semiconductor memory device by applying a test pattern to a memory device under test for a predetermined test cycle and comparing the resultant output of the memory device under test with expected value data to determine whether the memory device functions correctly or not, comprising:

a pattern generator for generating test data patterns to be supplied to the memory device under test;

a data selector for receiving the test data patterns from said pattern generator and providing said test data patterns in a parallel fashion at a plurality of ports;

a test data multiplexer for selecting said test data patterns at said plurality of ports to supply a plurality of test data patterns to said memory device in a series fashion having two or more data patterns within each of said predetermined test cycle;

an expected value select circuit for selectively providing said test data pattern as expected value data in a parallel fashion; and a logic comparator for receiving, in a parallel fashion, an output signal from said memory device under test generated as a result of said test data patterns in said series fashion and comparing, in parallel, said output signals with said expected value data from said expected value select circuit.

2. A memory test system as defined in claim 1, wherein said expected value select circuit includes a plurality of register and multiplexer pairs, said multiplexer in each of said pairs selecting one of said data patterns based on data from corresponding one of said registers.

3. A memory test system as defined in claim 1, wherein said logic comparator includes a plurality of latch and comparison circuit pairs, said latch in each of said pairs receiving said output signal from said memory under test and transferring said output signal to corresponding one of said comparison circuits by the timing of a strobe signal.

4. A memory test system as defined in claim 3, wherein said comparison circuit is an exclusive OR gate.

5. A memory test system as defined in claim 1, further comprising a wave formatter for shaping waveforms of said test data patterns to be supplied to said memory device under test and a driver for regulating amplitudes of said test data patterns to be supplied to said memory device under test, and an analog comparator for receiving said output signal from said memory device under test and producing a corresponding logic output signal.

6. A memory test system as defined in claim 1, wherein said test data multiplexer selects one of said test data patterns at said plurality of ports based on a pattern select signal from said pattern generator.

7. A memory test system as defined in claim 5, wherein said test data multiplexer is included in said wave formatter.

8. A memory test system as defined in claim 5, wherein said pattern generator is an algorithmic pattern generator for generating said test data patterns having a mathematical sequence.

* * * * *